(12) United States Patent
Wylie

(10) Patent No.: US 6,958,518 B2
(45) Date of Patent: Oct. 25, 2005

(54) SEMICONDUCTOR DEVICE HAVING AT LEAST ONE SOURCE/DRAIN REGION FORMED ON AN ISOLATION REGION AND A METHOD OF MANUFACTURE THEREFOR

(75) Inventor: Ian Wylie, Greenwich, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/882,624

(22) Filed: Jun. 15, 2001

(65) Prior Publication Data

US 2002/0190331 A1     Dec. 19, 2002

(51) Int. Cl.[7] .................... H01L 29/76; H01L 29/94; H01L 31/062; H01L 31/113; H01L 31/119; H01L 29/00; H01L 21/76
(52) U.S. Cl. .................... 257/395; 257/374; 257/396; 257/510; 257/513; 438/424
(58) Field of Search .................... 257/396, 369, 257/374, 394–399, 500, 300, 573, 506–521; 438/300, 424–438

(56) References Cited

U.S. PATENT DOCUMENTS

| | | | |
|---|---|---|---|
| 4,487,639 A * | 12/1984 | Lam et al. .................... 438/297 |
| 4,551,743 A * | 11/1985 | Murakami .................... 257/398 |
| 4,683,637 A * | 8/1987 | Varker et al. ................ 438/294 |
| 4,769,687 A | 9/1988 | Nakazato et al. | |
| 4,992,843 A | 2/1991 | Blossfeld et al. | |
| 5,043,778 A * | 8/1991 | Teng et al. .................. 257/374 |
| 5,086,322 A | 2/1992 | Ishii et al. | |
| 5,258,642 A | 11/1993 | Nakamura | |
| 5,391,907 A * | 2/1995 | Jang .......................... 257/396 |
| 5,834,793 A | 11/1998 | Shibata | |
| 5,877,046 A * | 3/1999 | Yu et al. ..................... 257/347 |
| 5,956,598 A * | 9/1999 | Huang et al. ................ 438/424 |
| 6,013,936 A | 1/2000 | Colt, Jr. | |
| 6,246,094 B1 * | 6/2001 | Wong et al. ................. 257/397 |
| 6,271,566 B1 | 8/2001 | Tsuchiaki | |
| 6,331,469 B1 * | 12/2001 | Park et al. .................. 438/296 |
| 6,344,669 B1 | 2/2002 | Pan | |
| 6,346,729 B1 * | 2/2002 | Liang et al. ................. 257/344 |
| 6,399,973 B1 * | 6/2002 | Roberds ..................... 257/288 |
| 6,465,852 B1 * | 10/2002 | Ju ............................. 257/396 |
| 2002/0142552 A1 * | 10/2002 | Wu ............................ 438/301 |

FOREIGN PATENT DOCUMENTS

| | | | | |
|---|---|---|---|---|
| JP | 5-335329 | 12/1993 | | |
| JP | 5-343415 | 12/1993 | | |
| JP | 11274483 A | * 10/1999 | ........... H01L 29/78 |

* cited by examiner

Primary Examiner—Erik Kielin

(57) ABSTRACT

The present invention provides a semiconductor device and a method of manufacture therefor. The semiconductor device includes a semiconductor substrate having a gate formed there over. The semiconductor device further includes an isolation region having at least one source/drain region formed there over.

26 Claims, 12 Drawing Sheets

US 6,958,518 B2

SEMICONDUCTOR DEVICE HAVING AT LEAST ONE SOURCE/DRAIN REGION FORMED ON AN ISOLATION REGION AND A METHOD OF MANUFACTURE THEREFOR

TECHNICAL FIELD OF THE INVENTION

The present invention is directed, in general, to a semiconductor device and, more specifically, to a semiconductor device having an isolation region and isolation structure, and a method of manufacture therefor.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit.

One way in which the semiconductor industry has increased the speed of the integrated circuit is to continue to shrink the size of the transistor. Over the last few years, the device size of the transistor has gone from 0.5 $\mu$m to 0.32 $\mu$m to 0.25 $\mu$m and now transistor device sizes are heading to the 0.10 $\mu$m range and below. With each decrease in size, however, the semiconductor industry has faced new challenges.

One of such challenges is that of reducing parasitic capacitance. As transistor geometries shrink, the time delay of signals propagating through the transistor are heavily influenced by the various parasitic capacitances inevitably associated with the structure, when fabricated according to the current state of the art. One of the principal remaining elements of transistor capacitance is the source-drain to substrate capacitance. This junction capacitance, as a function of area, is increasing as the technology advances. This is in part because one of the principal known failure mechanisms of a short channel transistor is controlled through the use of increased well doping. However, increased well doping reduces the diode depletion layer thickness in the well, which increases unit capacitance.

Another challenge is reducing "cross-talk." As is well known, cross-talk results when electrical noise, created by transistor devices, travels through the capacitive coupling of the substrate and negatively affects the performance of other devices on the chip. Though cross-talk has been a well-known phenomenon, up until recently it was of less concern. However, as a result of the use of multi-gigahertz operating frequencies in today's RF devices, the significance of cross-talk has increased dramatically. In addition, with the increase in packing density and decrease in device size, transistor devices are being manufactured on the same chip and closer and closer together, which increases the relative magnitude of the cross-talk problem. Thus, as a result of the increased packing density and the decreased device sizes, both taken in conjunction with the cross-talk problem, device performance and integration issues are becoming increasingly apparent.

Silicon-on-insulator (SOI) already provides a solution to these problems. However, this approach can require the use of a very high current implanter and a very high thermal budget. The use of the very high current implanter and very high thermal budget generally leads to increased manufacturing time, complexity, and most importantly, increased manufacturing cost. Additionally, the use of SOI may result in the transistor device having a floating back gate. Since the back gate of the transistor device is floating, the transistor operating voltages may float up or down, adversely affecting overall circuit performance, and reducing circuit design margins. Because of the aforementioned drawbacks of SOI, the semiconductor manufacturing industry is generally unwilling to use the SOI structure on many conventional semiconductor devices.

Accordingly, what is needed in the art is a semiconductor device and a method of manufacture thereof, that does not experience the problems experienced by the prior art.

SUMMARY OF THE INVENTION

To address the above-discussed deficiencies of the prior art, the present invention provides a semiconductor device and a method of manufacture therefor. In one embodiment, the semiconductor device includes a semiconductor substrate having a gate formed there over. The semiconductor device further includes an isolation region having at least one source/drain region formed there over.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
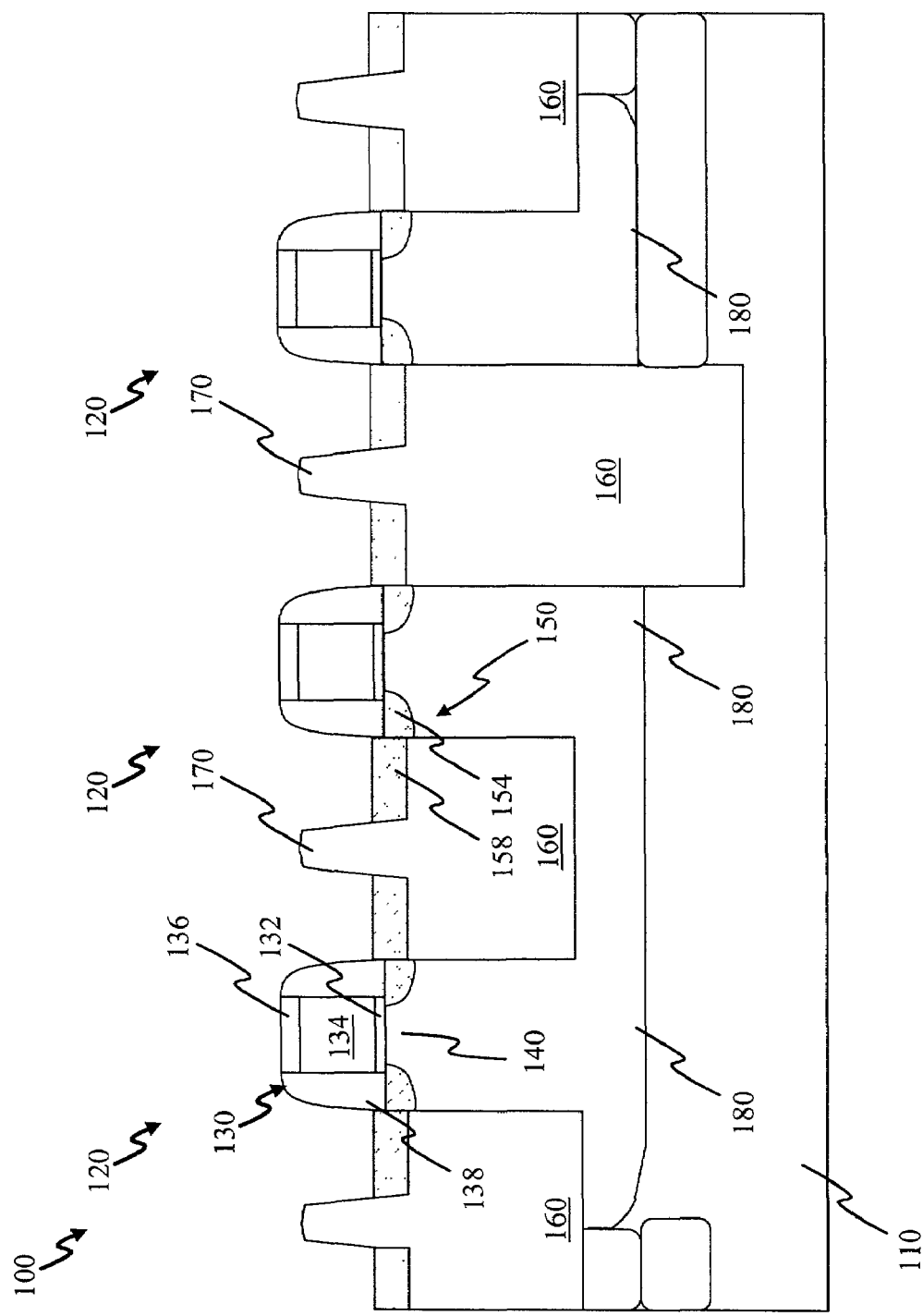
FIG. 1 illustrates a sectional view of one embodiment of a semiconductor structure constructed in accordance with the principles of the present invention.

Referring initially to FIG. 1, illustrated is one embodiment of a semiconductor structure, generally designated 100, constructed in accordance with the principles of the present invention. In the embodiment illustrated in FIG. 1, the semiconductor structure 100 includes a semiconductor substrate 110. The semiconductor substrate 110 may be any layer located in an integrated circuit, including a layer located at the wafer level, such as an epitaxial layer, or a layer located within the wafer, such as a doped region.

Located over the semiconductor substrate 110, are semiconductor devices 120. In the illustrative embodiment shown in FIG. 1, each of the semiconductor devices 120 include a transistor gate 130, having a gate oxide 132, a gate electrode 134, an etch stop layer 136 and gate sidewall spacers 138. The semiconductor devices 120 may further include a channel region 140 located in the semiconductor substrate 110. Additionally, the semiconductor devices 120 may include source/drain regions 150. In the illustrative embodiment shown in FIG. 1, the source/drain regions 150 include a first source/drain portion 154 located in the semiconductor substrate 110, and a second source/drain portion 158 located in or on an isolation region 160. In the illustrative embodiment shown in FIG. 1, the second source/drain portions 158 extend from the first source/drain portion 154 to an isolation structure 170. While transistors have been shown, it should be understood that the scope of the present invention is applicable with any other type of semiconductor devices that benefit from electrical isolation. Additionally, the term isolation region, as used throughout the present document, excludes a conventional silicon-on-insulator (SOI) structure that is a buried film located across the wafer. It should be noted, however, that any other isolation region is within the scope of the present invention.

In an advantageous embodiment, the isolation regions 160 and isolation structures 170 comprise a dielectric material, such as an oxide, and are located adjacent the transistor gate but not under the channel region 140. Also, the depth of the isolation regions 160 may vary, depending on their function. For example, in one embodiment, the isolation regions 160 may extend through transistor tubs 180, isolating the transistor tubs 180 from each other. However, in another embodiment, the isolation regions 160 may not extend through the transistor tubs 180, resulting in the transistor tubs 180 being maintained at a same electrical potential. This may depend on whether transistor tubs of adjacent semiconductor devices 120 are desired to be maintained at the same potential. For example, if the isolation regions 160 do not extend through adjacent transistor tubs 180 that are similarly doped, a single tub tie can be used to provide an electrical potential for the adjacent transistor tubs 180 that are similarly doped. This may provide an added benefit.

The isolation structures 170 may comprise isolation posts, as illustrated in FIG. 1. In general, the isolation structures 170 are designed to isolate the source/drain regions 150 of one semiconductor device 120, from the source/drain regions 150 of another semiconductor device 120.

The isolation regions 160 provide the semiconductor devices 120 with a degree of isolation not currently available in the prior art. Because the isolation regions are not located under the channel region 140, the present invention does not experience floating back gate voltages, as experienced in some of the prior art devices. Also, since the width of the isolation structure 170 is only restricted by current photolithographic limitations, more semiconductor devices 120 may be included within a given area than prior art devices. Where the transistor to transistor spacing in the prior art devices ranged from about 600 nm to about 800 nm, the transistor to transistor spacing, in one particular embodiment of the present invention, is less than about 300 nm. Additionally, the present invention, in one advantageous embodiment, achieves from about 10% to about 20% improvement in packing density than prior art devices.

Additionally, since the semiconductor devices 120 may be almost completely surrounded by the isolation regions 160, except for under the channel region 140, the transistor to transistor isolation breakdown voltage is greatly improved. In addition, since the second portion of the source/drain regions 158 may be very shallow and scalable, and the transistor tubs 180 and their associated junctions may be localized to very small areas directly under the semiconductor devices 120, the tub to tub breakdown voltages will be greatly improved, and the latch-up design restraints will be substantially reduced. This dramatically improves radiation hardness and reduces the source/drain region 150 contact depths, thus, improving the punch-through performance of the semiconductor devices 120.

Figure 2:
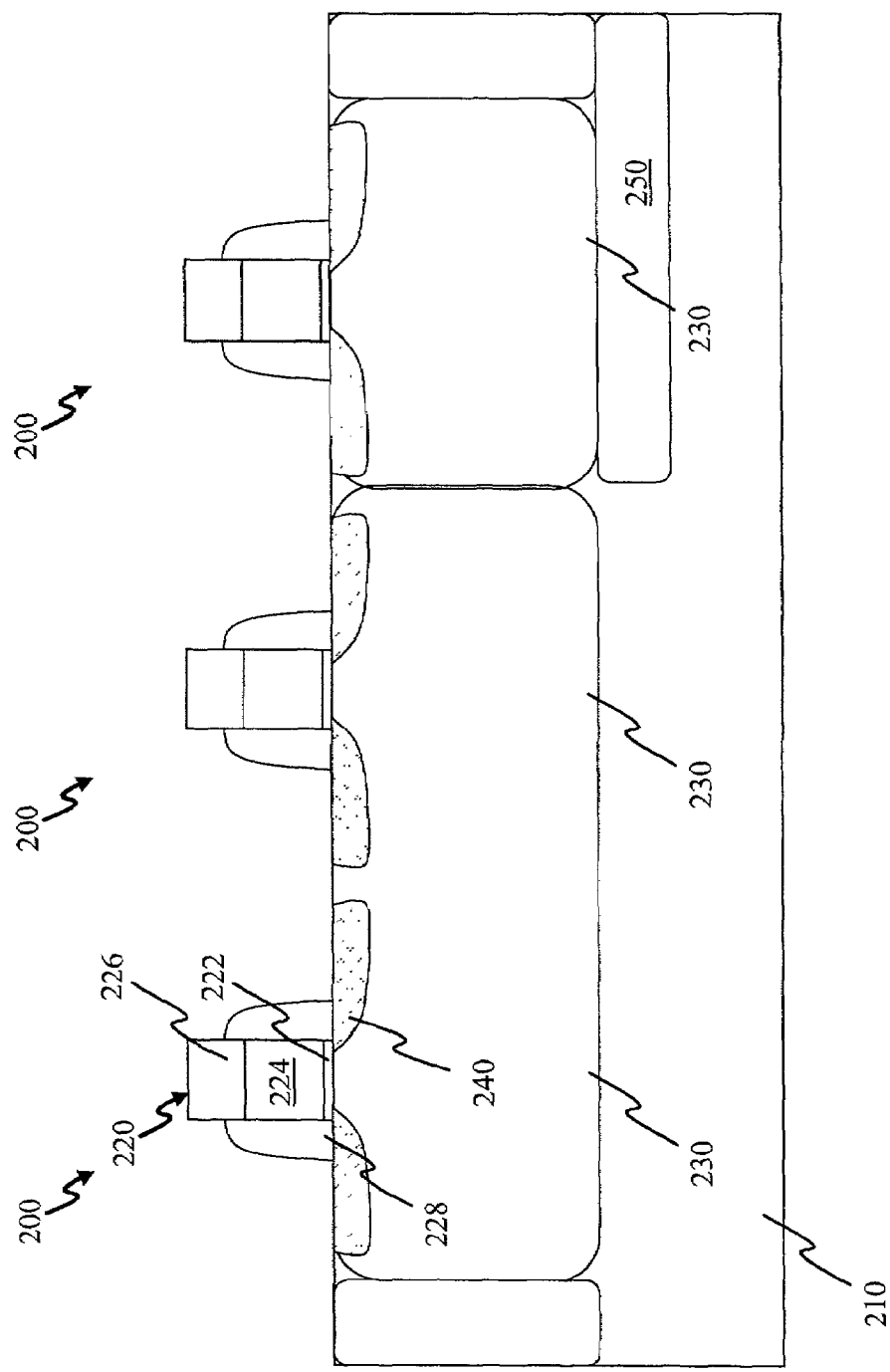
FIG. 2 illustrates a sectional view of partially completed semiconductor devices at an initial manufacturing step.

Turning now to FIGS. 2-11, illustrated are detailed steps illustrating how a semiconductor device, similar to the semiconductor devices 120 illustrated in FIG. 1, might be manufactured. Illustrated in FIG. 2, are partially completed semiconductor devices 200. In the embodiment illustrated in FIG. 2, the semiconductor devices 200 include transistor gates 220 located over a semiconductor substrate 210. The transistor gates 220 include conventionally formed gate oxides 222, gate electrodes 224, etch stop layers 226, and gate sidewall spacers 228.

The etch stop layers 226 may comprise many materials, however, in the illustrative embodiment shown in FIG. 2, the etch stop layers 226 are nitride etch stop layers. This is particularly advantageous, because a subsequent oxide etching step will not substantially affect the nitride etch stop layers. The thickness of the etch stop layers 226, in an exemplary embodiment, should be designed, such that the etch stop layers 226 can withstand subsequent chemical mechanical planarization (CMP) and etching steps (discussed below). In one exemplary embodiment, the etch stop layers 226 have a thickness of about 200 nm, and can withstand at least three subsequent CMP steps.

The gate sidewall spacers 228, similar to the etch stop layers 226, may comprise many materials. Also similar to the etch stop layers 226, the gate sidewall spacers 228 may comprise a nitride material. Located under the transistor gates 220 and within transistor tubs 230 located within the semiconductor substrate 210, are lightly doped source/drain regions 240. The lightly doped source/drain regions 240, depending on whether the partially completed semiconductor devices 220 are going to be P-channel metal oxide semiconductor (PMOS) devices or N-channel metal oxide semiconductor (NMOS) devices, will be doped with boron or phosphorous, respectively. Additionally, the lightly doped source/drain regions 240 may be doped to a concentration ranging from about 1E18 atoms/cm$^3$ to about 1E20 atoms/cm$^3$. In the embodiments illustrated in FIGS. 2–11, buried layers 250 are located under the transistor tubs 230. It should be noted that the buried layers 250 only represent one embodiment of the invention, thus, need not be included in all embodiments.

Figure 3:
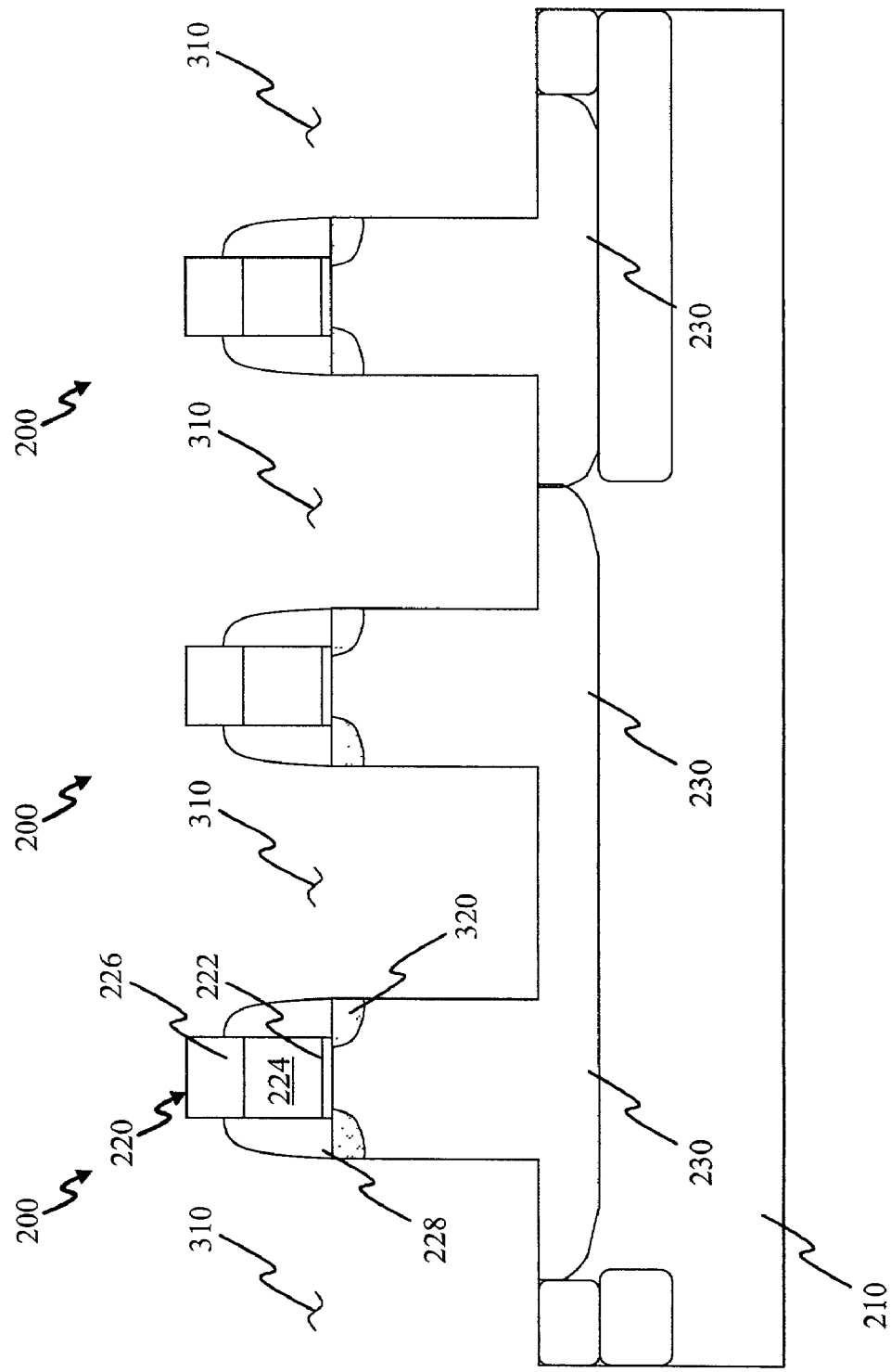
FIG. 3 illustrates a sectional view of the partially completed semiconductor devices illustrated in FIG. 2, after formation of shallow isolation trenches.

Turning now to FIG. 3, illustrated are the partially completed semiconductor devices 200 illustrated in FIG. 2, after formation of shallow isolation trenches 310. The shallow isolation trenches 310 etch through a portion of the lightly doped source/drain regions 240 (FIG. 2), forming first source/drain portions 320. The shallow trench isolation trenches 310, in one particular embodiment, are formed using a conventional silicon trench. In the current example, no photolithographic mask is required to form the shallow isolation trenches 310. Moreover, the etch stop layers 226 and the gate sidewall spacers 228 perform like self-aligning masks. As such, the oxide etching process does not substantially affect the etch stop layers 226 and the gate sidewall spacers 228.

In the embodiment shown in FIG. 3, the shallow isolation trenches 310 are not deep enough to separate the transistor tubs 230 from each other. The depth of the shallow isolation trenches 310 may vary depending on the depth of the associated transistor tubs 230. Additionally, the width of the shallow isolation trenches 310 may vary according to design specifications of a particular device. However, in one exemplary embodiment, the shallow isolation trenches 310 have a width of less than about 1700 nm, and in a more exemplary embodiment, a width ranging from about 1000 nm to about 1200 nm.

Figure 4:
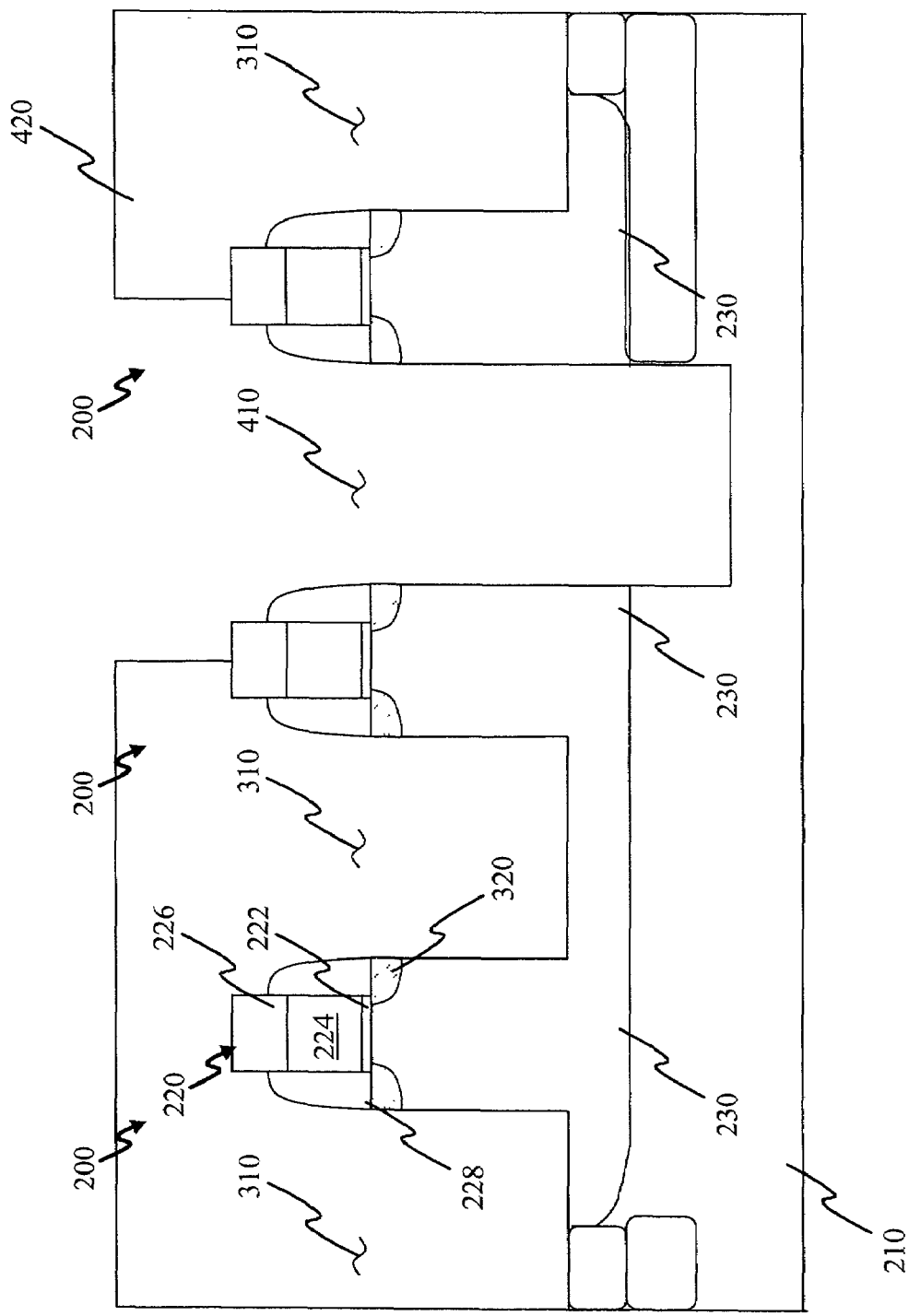
FIG. 4 illustrates a sectional view showing the formation of deep isolation trenches.

Turning to FIG. 4, illustrated is the formation of a deep isolation trench 410. When forming a combination of shallow isolation trenches 310 and deep isolation trenches 410, the shallow isolation trenches 310 should be protected from the deep isolation trench etch, using a photolithographic mask 420. The photolithographic mask 420 allows the deep isolation trench 410 to be formed down to and through the transistor tubs 230, while maintaining the pre-defined depth of the shallow isolation trenches 310. The depth of the deep isolation trench 410, again, may vary according to a desired design of the particular device. However, for proper isolation between transistor tubs 230, the depth should at least go down to and through the transistor tubs 230.

One skilled in the art is familiar with how to precisely form isolation trenches 310, 410, to varying depths. In one embodiment, this entails an iterative process. Additionally, while it has been shown that three shallow isolation trenches 310 and one deep isolation trench 410 may be used, one skilled in the art understands that any combination of shallow isolation trenches 310 and deep isolation trenches 410 may be used, including using only one or the other. Additionally, one skilled in the art understands that the shallow isolation trenches 310 and deep isolation trenches 410 need not only be used for semiconductor devices 200 having certain dopant schemes. Most any combination of isolation trench type and dopant scheme, will work.

Figure 5:
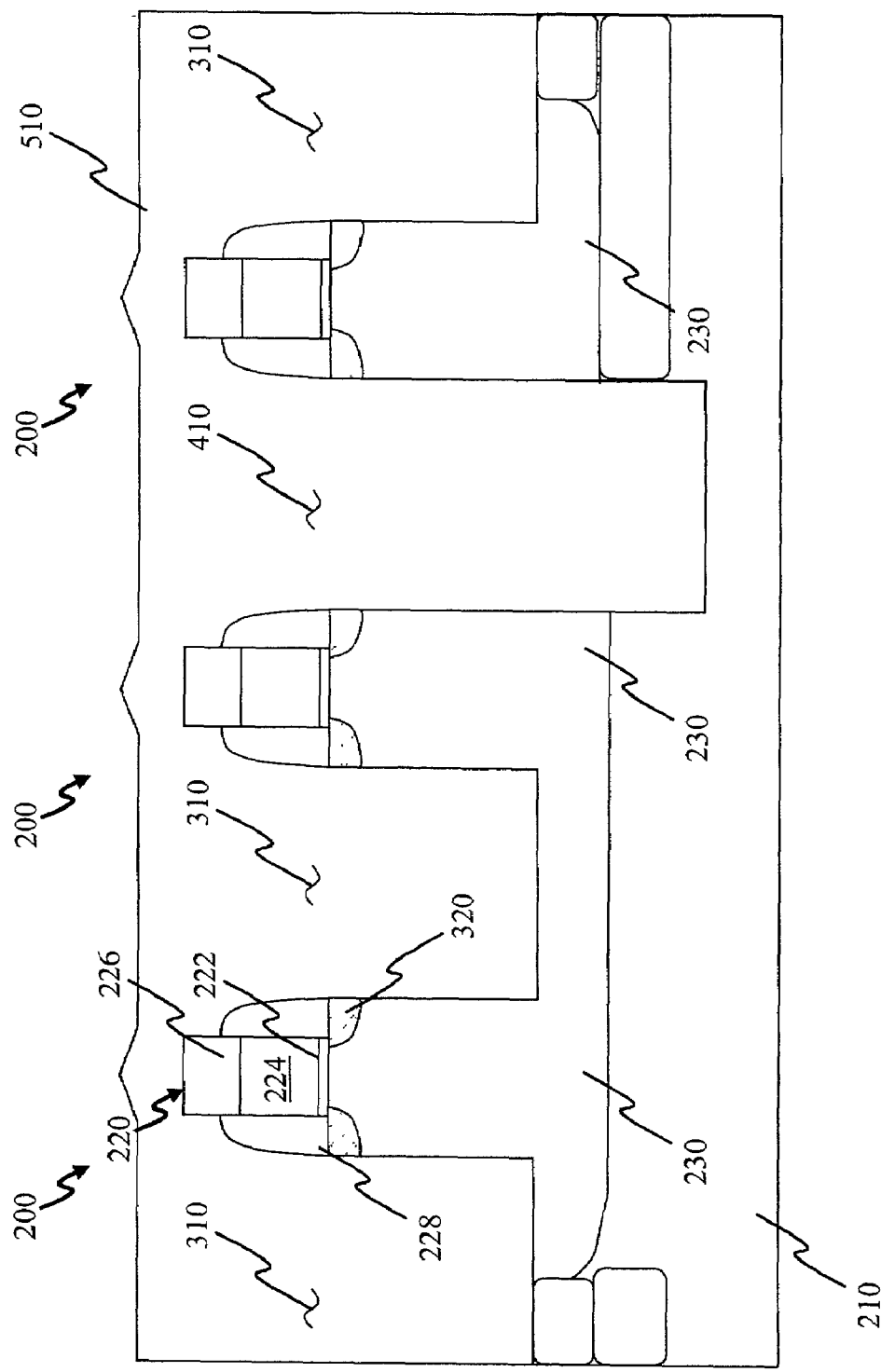
FIG. 5 illustrates a sectional view of the partially completed semiconductor devices illustrated in FIG. 4, after formation of an isolation material.

Turning now to FIG. 5, illustrated are the partially completed semiconductor devices 200 illustrated in FIG. 4, after removal of the photolithographic mask 420, and formation of an isolation material 510 over the substrate 210 and within the shallow and deep isolation trenches 310, 410, respectively. The isolation material 510, which is preferably an oxide, may be formed using any known or hereafter discovered process. However, in the illustrative embodiment shown in FIG. 5, the isolation material 510 is formed using a chemical vapor deposition (CVD) process. After the isolation material 510 has been formed, the excess isolation material 510 located over the etch stop layers 226, may be removed. The excess isolation material 510 may be removed using any known process, including a CMP process. In such an instance, the etch stop layer 226 may be thinned, however, the thickness of the etch stop layer 226 should also be pre-defined during its manufacture to withstand such a process.

Figure 6:
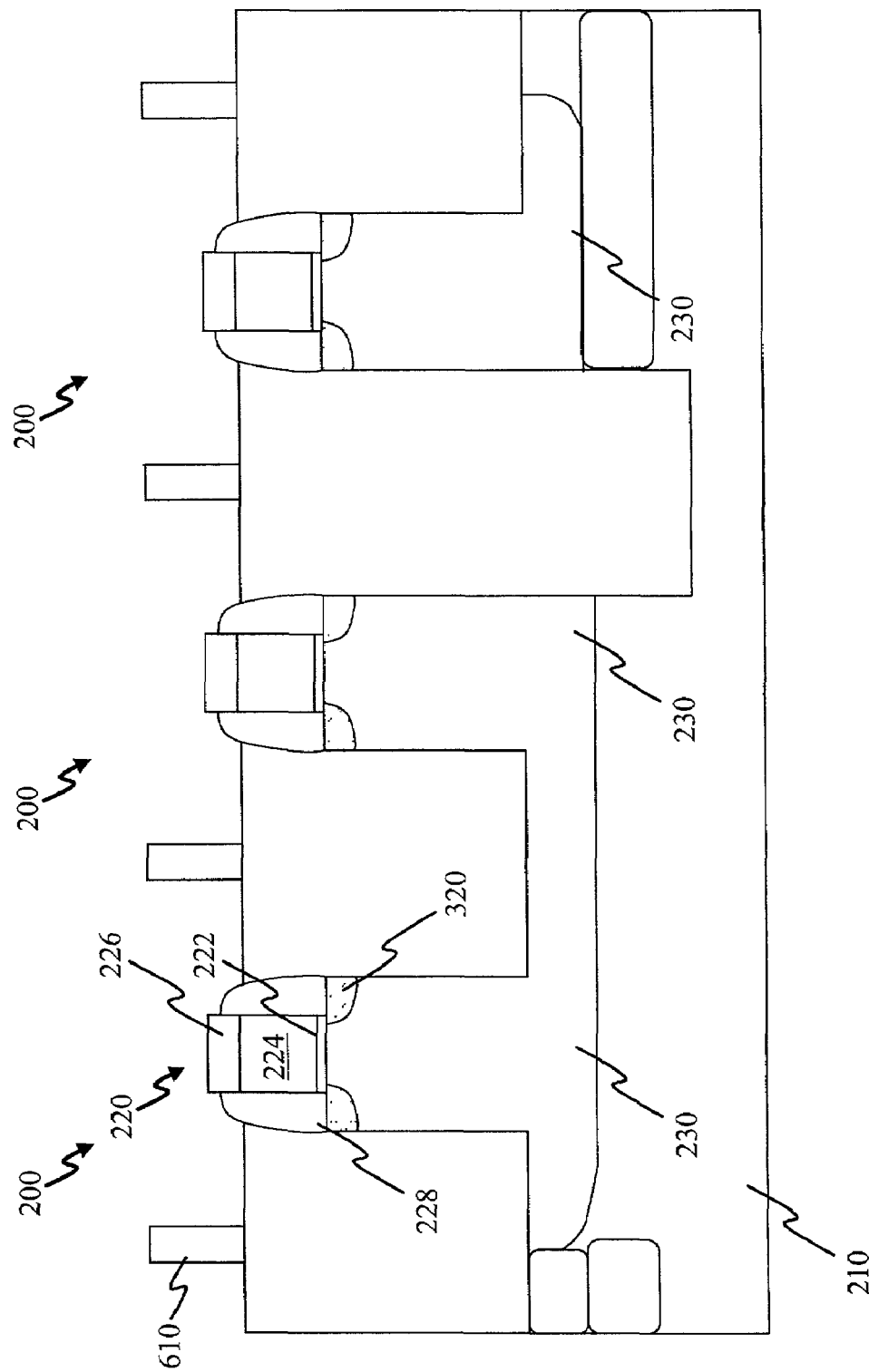
FIG. 6 illustrates a sectional view of the partially completed semiconductor devices illustrated in FIG. 5, after formation of photolithographic masks.

Turning to FIG. 6, illustrated are the partially completed semiconductor devices 200 illustrated in FIG. 5, after the CMP step, and the conventional formation of photolithographic masks 610. The width of the photolithographic masks 610, in an exemplary embodiment, may be equal to about a minimum lithographic value attainable. Currently, this value is about 150 nm. As time passes, however, this value will undoubtedly decrease. As illustrated, the photolithographic masks 610 may be located over a center of each of the shallow and deep isolation trenches 310, 410.

Figure 7:
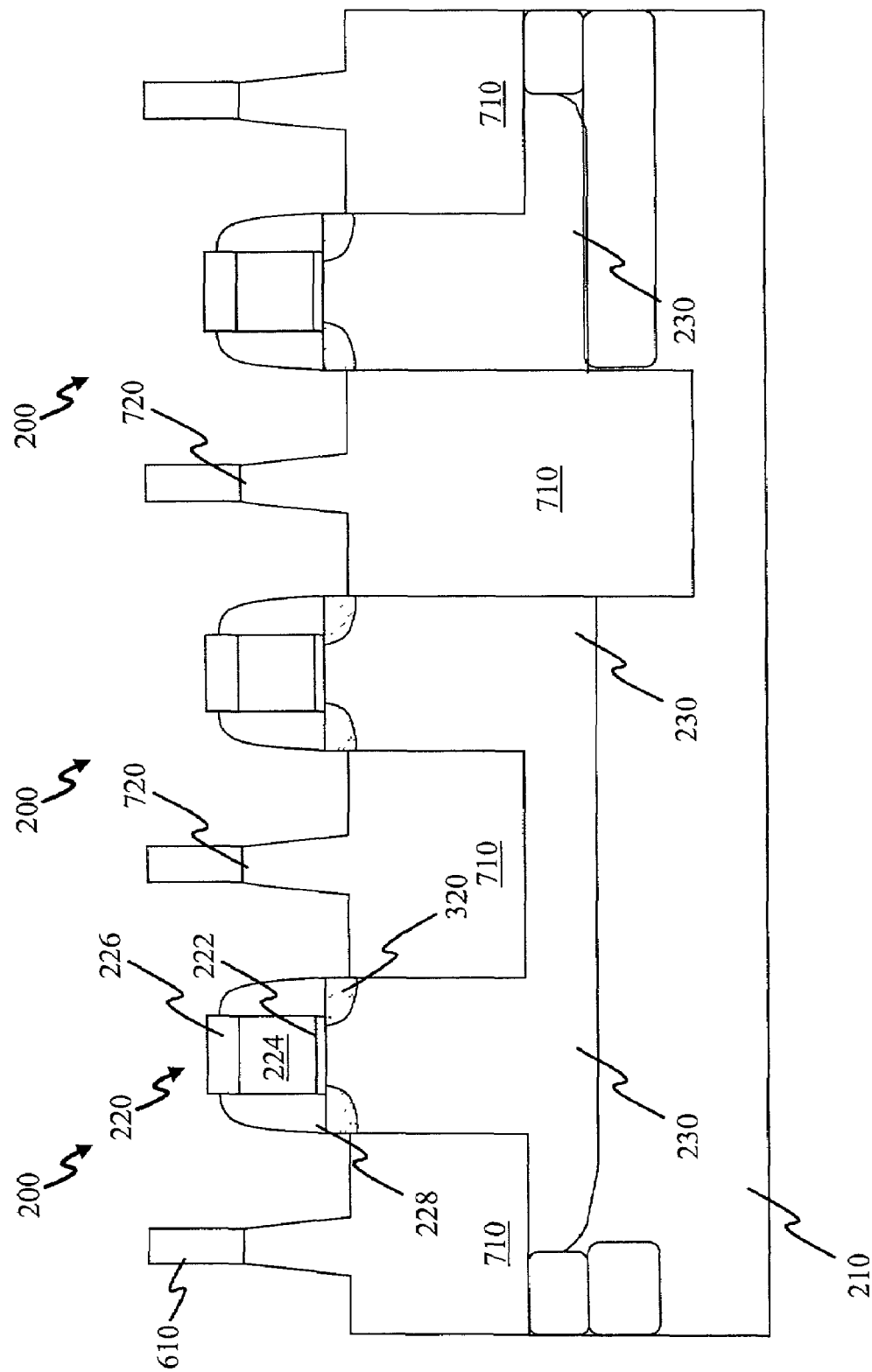
FIG. 7 illustrates a sectional view of the partially completed semiconductor devices illustrated in FIG. 6, after performing an isolation material etch.

Turning to FIG. 7, illustrated are the partially completed semiconductor devices 200 illustrated in FIG. 6, after performing an isolation material etch. The isolation material etch removes those portions of the isolation material 510 (FIG. 5) not protected by the photolithographic masks 610, the etch stop layers 226 and the gate sidewall spacers 228, thus, defining isolation regions 710 and isolation structures 720. In one particular embodiment, the isolation regions 710 and isolation structures 720 are integrally connected. In the illustrative embodiments shown in FIG. 7, the isolation structures 720 comprise posts. The isolation structures 720 are designed to isolate source/drains regions of the various adjacent semiconductor devices.

In one advantageous embodiment, the isolation material etch comprises a selective anisotropic isolation material etch, which removes the isolation material down to a point just above a lowest region of the first source/drain portions 320. Since no etch stop is available to prevent the oxide etch from removing too much isolation material 510, in an exemplary embodiment, the etch may be performed using small interval steps.

Figure 8:
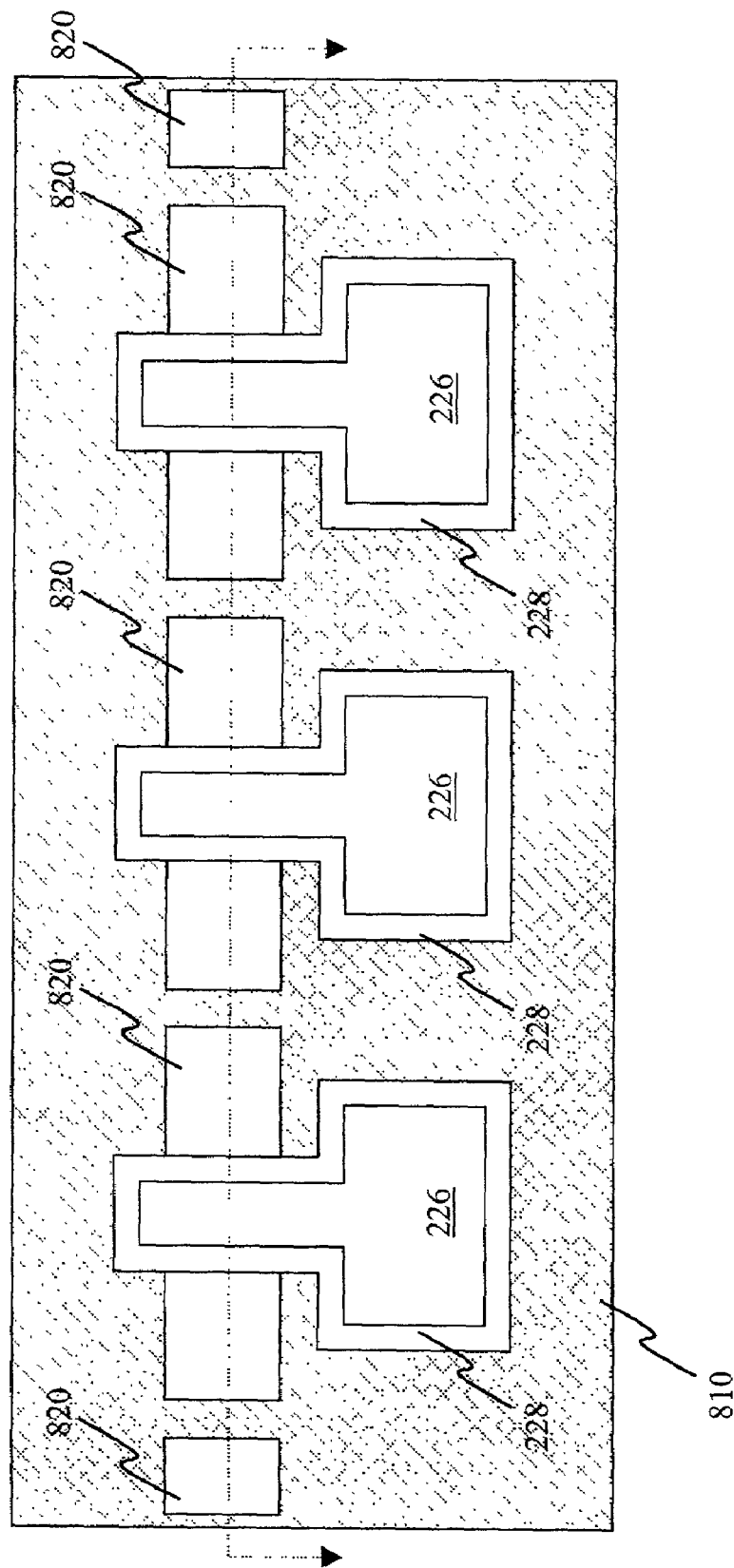
FIG. 8 illustrates a top view of the partially completed semiconductor device illustrated in FIG. 7.

Turning briefly to FIG. 8, illustrated is a top view of the partially completed semiconductor device illustrated in FIG. 7. For clarity, any portion of raised isolation material surrounding the partially completed semiconductor devices 200 is depicted with a crosshatched area 810. Additionally, any portion of etched isolation material surrounding the partially completed semiconductor devices 220, is depicted by squares 820. The etch stop layer 226, and the gate sidewall spacers 228, are also depicted in FIG. 8.

Figure 9:
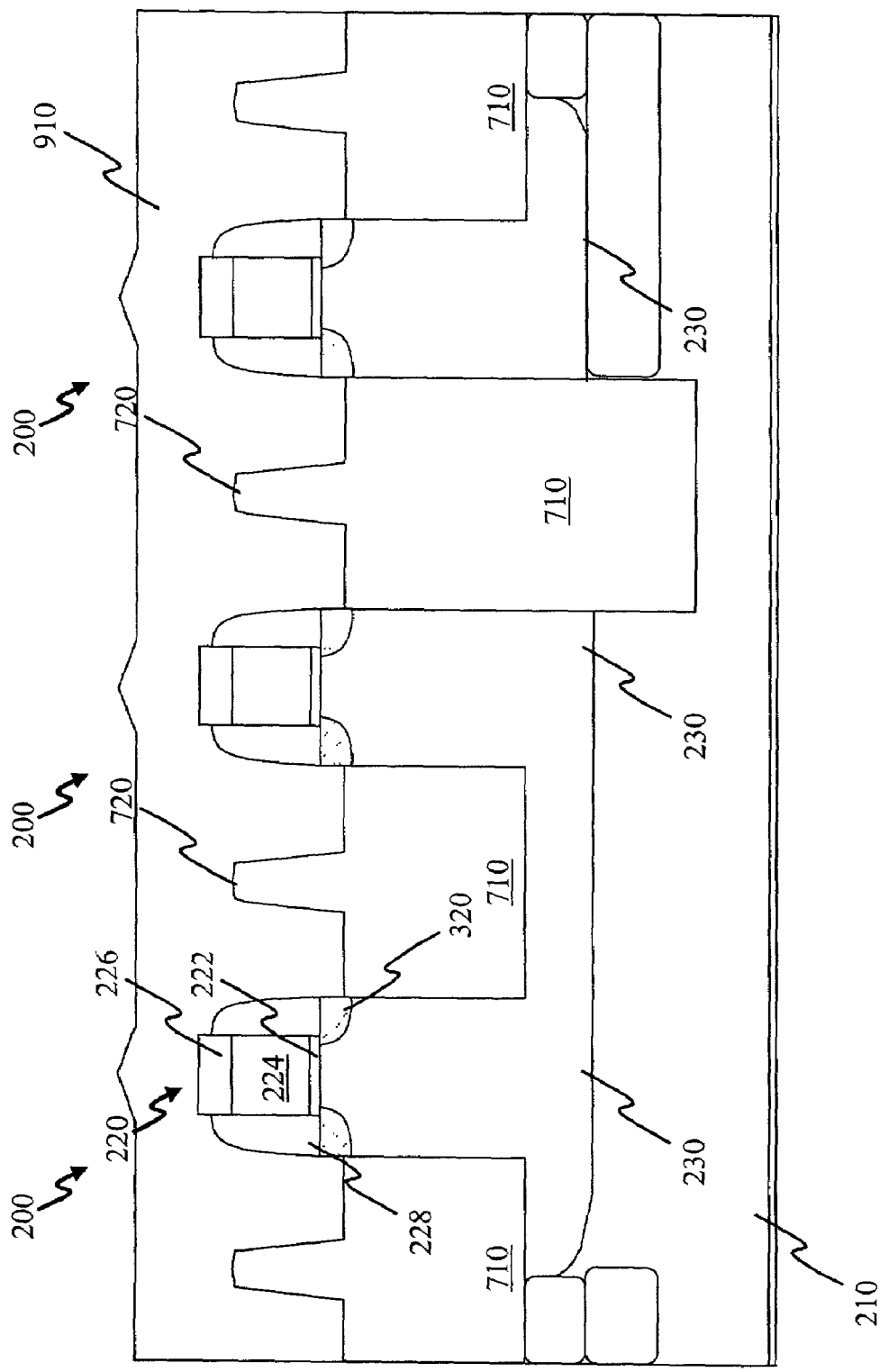
FIG. 9 illustrates a sectional view of the partially completed semiconductor devices illustrated in FIGS. 7 and 8, after formation of a blanket layer of source/drain contact material.

Turning now to FIG. 9, illustrated are the partially completed semiconductor devices 200 illustrated in FIGS. 7 and 8, after formation of a blanket layer of source/drain contact material 910. The source/drain contact material 910 may comprise many materials, including polysilicon. In an exemplary embodiment, however, the source/drain contact material 910 comprises a metal, and preferably a metal silicide, such as cobalt silicide. If a pure metal, e.g., cobalt, is used, the partially completed semiconductor devices 200 may be annealed, causing the pure metal to react with the silicon in the first source/drain portions 320, thus, forming a metal silicide. The anneal step also attempts to substantially reduce contact resistance between the first source/drain portions 320 and the source/drain contact material 910. The source/drain contact material 910 may subsequently be planarized back to the etch stop layers 226.

Figure 10:
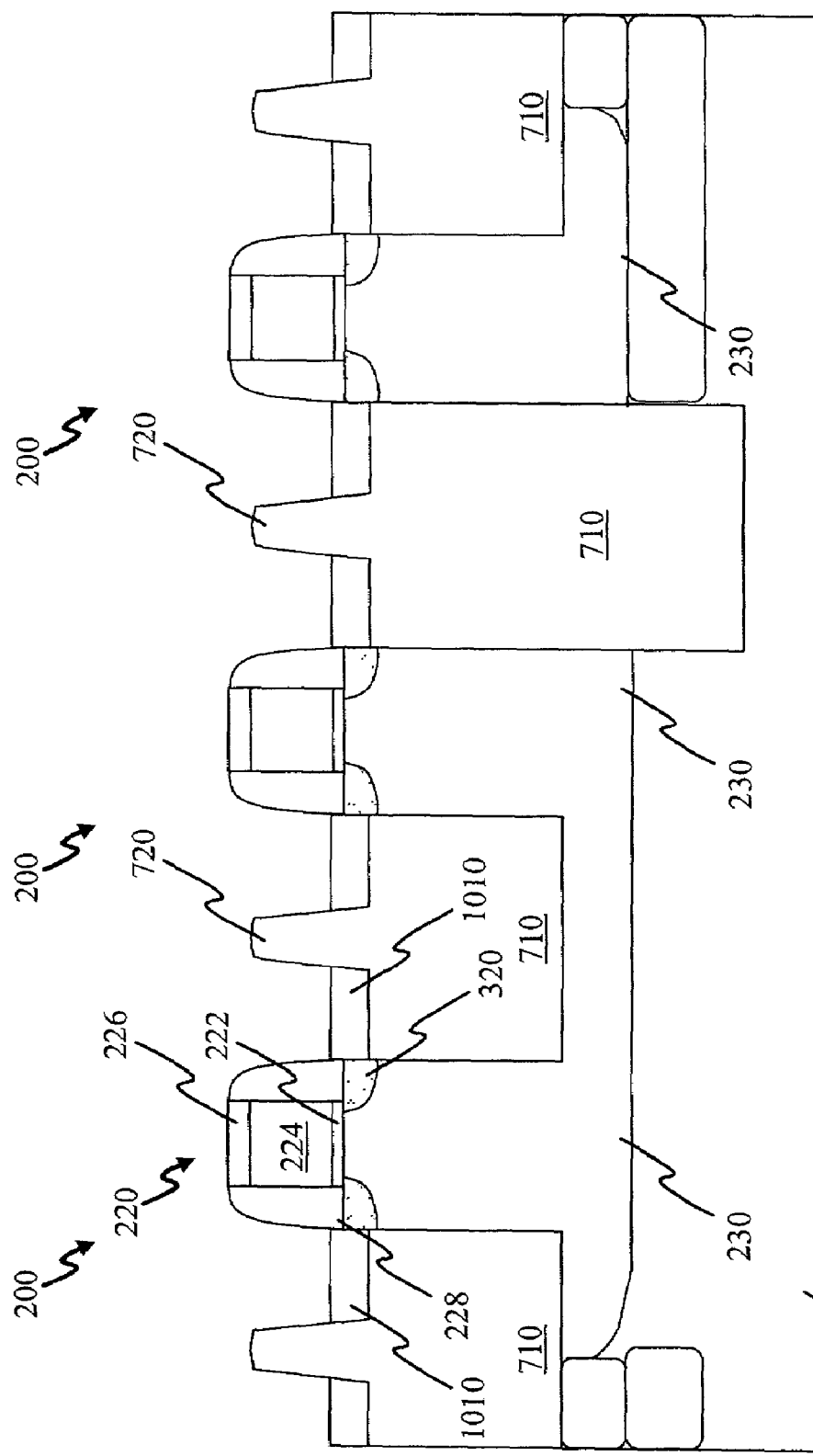
FIG. 10 illustrates a sectional view of the partially completed semiconductor devices illustrated in FIG. 9, after formation of second source/drain portions.

Turning now to FIG. 10, illustrated is the partially completed semiconductor devices 200 illustrated in FIG. 9, after formation of second source/drain portions 1010. An etching process, generally requiring no photolithographic masks, may be used to form the second source/drain portions 1010. The etching process should leave enough of the source/drain contact material 910 to provide substantial contact with the first source/drain portions 320. As illustrated, the second source/drain portions 1010 are located on the isolation regions 710 and extend from the first source/drain portions 320 to the isolation structures 720.

Figure 11:
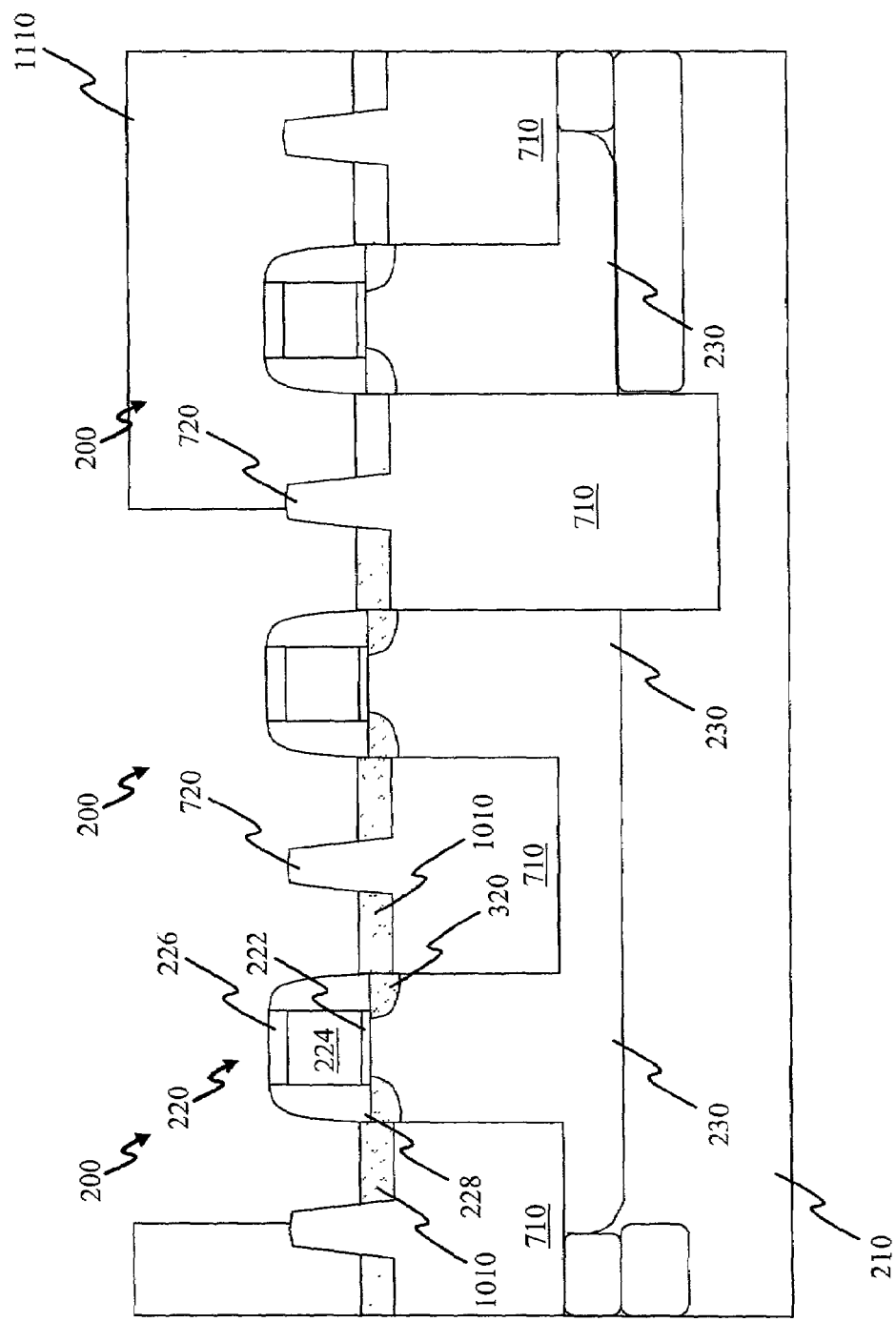
FIG. 11 illustrates a sectional view of the partially completed semiconductor devices illustrated in FIG. 10, after the second source/drain portions have been subjected to a P-type or N-type dopant.

Turning to FIG. 11, illustrated are the partially completed semiconductor devices 200 illustrated in FIG. 10, after the second source/drain portions 1010 have been subjected to a P-type or N-type dopant. In an exemplary embodiment of the invention, the second source/drain portions 1010 are doped to a maximum concentration possible. For example, the second source/drain portions 1010 may be doped to a concentration of up to about 1E21 atoms/cm$^3$. Because the isolation regions 710 and isolation structures 720 surround the second source/drain portions 1010 on all sides, except the first source/drain portion 320 side, the second source/drain portions 1010 may be implanted to a maximum dopant concentration without a concern that the dopant will diffuse into the transistor tubs 230. After completion of the second source/drain portions 1010, photoresist portions 1110 may be removed, resulting in the completed semiconductor devices 120 illustrated in FIG. 1.

Figure 12:
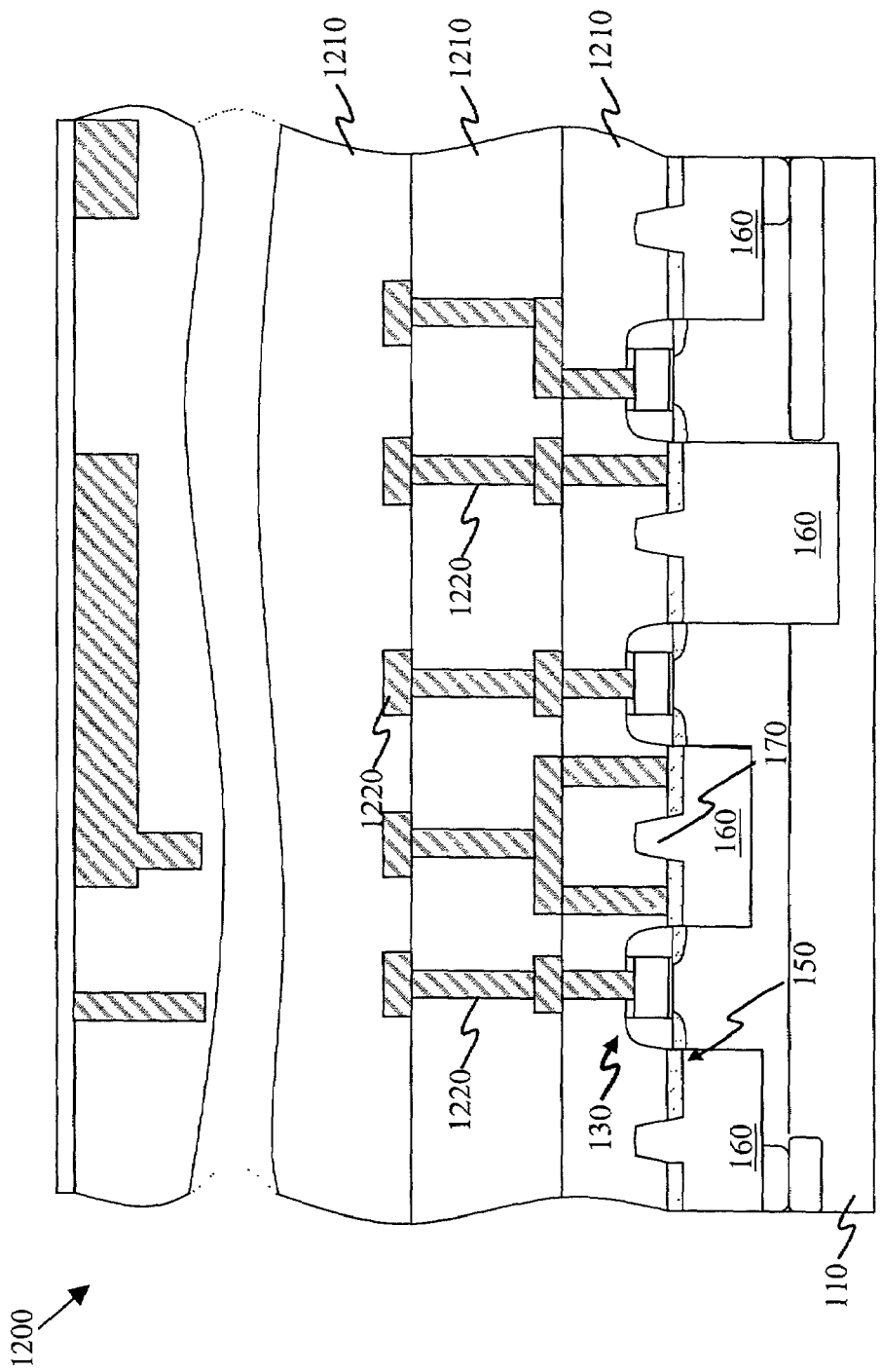
FIG. 12 illustrates a sectional view of a conventional integrated circuit, which incorporates the completed semiconductor devices illustrated in FIG. 1.

Referring finally to FIG. 12, illustrated is a sectional view of a conventional integrated circuit (IC) 1200, incorporating the completed semiconductor devices 120 illustrated in FIG. 1. The IC 1200 may also include active devices, such as Bipolar devices, BiCMOS devices, memory devices, or other types of active devices. The IC 1200 may further include passive devices, such as inductors or resistors, or it may also include optical devices or optoelectronic devices. Those skilled in the art are familiar with these various types of devices and their manufacture.

In the particular embodiment illustrated in FIG. 12, the IC 1200 includes the semiconductor devices 120, including the transistor gates 130, source/drain regions 150, isolation regions 160 and isolation structures 170. As illustrated, dielectric layers 1210 are located over the semiconductor devices 120. Additionally, interconnect structures 1220, are located within the dielectric layers 1210, contacting the semiconductor devices 120 to form the operational integrated circuit 1200.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a semiconductor substrate;
   a gate formed above the semiconductor substrate, the gate having gate sidewall spacers located along sidewalls thereof;
   an isolation region having a first portion within a trench formed in the semiconductor substrate and a second post portion extending above the first portion, wherein the second post portion is narrower in width than the first portion and extends above the semiconductor substrate, and wherein no structural interface exists between the first and second portions of the isolation region;
   a first portion of one of a source/drain region formed in the semiconductor substrate and a second portion of the one of the source/drain region formed on the isolation region and in contact with the second post portion but not in the semiconductor substrate wherein the second portion of the one of the source/drain region comprises polysilicon.

2. The semiconductor device as recited in claim 1 wherein the isolation region is formed adjacent the semiconductor substrate.

3. The semiconductor device at recited in claim 1 wherein the isolation region is not located under a channel region.

4. The semiconductor device as recited in claim 1 wherein the isolation region comprises an oxide.

5. The semiconductor device as recited in claim 1 wherein the isolation regions extends through a transistor tub.

6. A semiconductor device, comprising:
   a channel region located in a semiconductor substrate;
   a trench located adjacent a side of the channel region;
   an isolation region formed over the semiconductor substrate, the isolation region having a first portion within a trench formed in the semiconductor substrate and a second post portion extending above the first portion, wherein the second post portion is narrower in width than the first portion and extends above the semiconductor substrate, and wherein no structural interface exists between the first and second portions of the isolation region; and
   a first portion of one of source/drain region formed in the semiconductor substrate and a second portion of the one of the source/drain region formed on the isolation region and in contact with the second post portion but not in the semiconductor substrate wherein the second portion of the one of the source/drain region comprises polysilicon.

7. The semiconductor device as recited in claim 6 wherein the isolation region is not located under the channel region.

8. The semiconductor device as recited in claim 6 wherein the isolation region comprises an oxide.

9. The semiconductor device as recited in claim 6 wherein the isolation region extends through a transistor tub.

10. A semiconductor device, comprising:
    a channel region located in a semiconductor substrate;
    an isolation region located adjacent but not extending under the channel region the isolation region having a first portion within a trench formed in the semiconductor substrate and a second post portion extending above the first portion, wherein the second post portion is narrower in width than the first portion and extends above the semiconductor substrate, and, wherein no structural interface exists between the first and second portions of the isolation region; and
    source/drain regions having a first portion located in the semiconductor substrate and a second portion located on the isolation region and in contact with the second post portion, but not in the semiconductor substrate wherein the second portion of the one of the source/drain region comprises polysilicon.

11. The semiconductor device as recited in claim 10 wherein the isolation region comprises an oxide.

12. The semiconductor device as recited in claim 10 wherein the isolation region extends through a transistor tub.

13. The semiconductor device as recited in claim 10 wherein the source/drain regions are first source/drain regions of a first transistor, and the semiconductor device further includes second source/drain regions of a second adjacent transistor, wherein the first source/drain regions are isolated from the second source/drain regions by the isolation region.

14. A semiconductor device, comprising:
   a first transistor located adjacent a second transistor, wherein both the first and second transistors are located over a semiconductor substrate;
   an isolation region located between the first and second transistors, the isolation region having a first portion within a trench formed in the semiconductor substrate and a second post portion extending above the first portion, wherein the second post portion is narrower in width than the first portion and extends above the semiconductor substrate, and wherein no structural interface exists between the first and second portions of the isolation region; and
   source/drain regions associated with each of the first and second transistors, each of the source/drain regions having a first portion located in the semiconductor substrate and a second portion located on the isolation region and in contact with the second post portion, but not in the semiconductor substrate wherein the second portion of the one of the source/drain region comprises polysilicon.

15. The semiconductor device as recited in claim 14 wherein the isolation region comprises an oxide.

16. The semiconductor device as recited in claim 14 wherein the isolation region extends through a transistor tub.

17. A method of manufacturing a semiconductor device, comprising:
   providing a semiconductor substrate;
   creating a gate above the semiconductor substrate, the gate having gate sidewall spacers located along sidewalls thereof;
   forming an isolation region having a first portion within a trench formed in the semiconductor substrate and a second post portion extending above the first portion, wherein the second post portion is narrower in width than the first portion and extends above the semiconductor substrate, and, wherein no structural interface exists between the first and second portions of the isolation region;
   forming a first portion of one of a source/drain region in the semiconductor substrate and a second portion of the one of the source/drain region on the isolation region and in contact with the second post portion but not in the semiconductor substrate wherein the second portion of the one of the source/drain region comprises polysilicon.

18. The method as recited in claim 17 wherein forming an isolation region includes forming an isolation region adjacent to the semiconductor substrate.

19. The method as recited in claim 17 wherein forming an isolation region includes forming an isolation region includes forming an isolation region that is not located under a channel region.

20. The method as recited in claim 17 wherein forming an isolation region includes forming an oxide isolation region.

21. The method as recited in claim 17 wherein forming an isolation region includes forming an isolation region that extends through a transistor tub.

22. An integrated circuit, comprising:
   semiconductor devices, including;
      a semiconductor substrate;
      a gate formed above the semiconductor substrate, the gate having gate sidewall spacers located along sidewalls thereof;
      an isolation region having a first portion within a trench formed in the semiconductor substrate and a second post portion extending above the first portion, wherein the second post portion is narrower in width than the first portion and extends above the semiconductor substrate, and wherein no structural interface exists between the first and second portions of the isolation region;
      a first of one of a source/drain region formed in the semiconductor substrate and a second portion of the one of the source/drain region formed on the isolation region and in contact with the second post portion but not in the semiconductor substrate wherein the second portion of the one of the source/drain region comprises polysilicon; and
   interconnect structures contacting the semiconductor devices.

23. The integrated circuit as recited in claim 22 wherein the isolation region is formed adjacent the semiconductor substrate.

24. The integrated circuit as recited in claim 22 wherein the isolation region is not located under a channel region.

25. The integrated circuit as recited in claim 22 wherein the isolation region comprises an oxide.

26. The integrated circuit as recited in claim 22 wherein the isolation region extends through a transistor tub.

* * * * *